(12) United States Patent
Kuwabara et al.

(10) Patent No.: US 8,829,976 B2
(45) Date of Patent: Sep. 9, 2014

(54) SWITCHING-ELEMENT DRIVE CIRCUIT

(71) Applicants: Yasushi Kuwabara, Tokyo (JP); Katsuhiko Saito, Tokyo (JP); Masahiro Fukuda, Tokyo (JP)

(72) Inventors: Yasushi Kuwabara, Tokyo (JP); Katsuhiko Saito, Tokyo (JP); Masahiro Fukuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/779,980

(22) Filed: Feb. 28, 2013

(65) Prior Publication Data

US 2013/0234778 A1 Sep. 12, 2013

(30) Foreign Application Priority Data

Mar. 6, 2012 (JP) ................................ 2012-049438

(51) Int. Cl.

| H03K 17/56 | (2006.01) |
|---|---|
| H03K 17/16 | (2006.01) |
| H02M 1/08 | (2006.01) |
| H02M 1/44 | (2007.01) |
| H02M 1/42 | (2007.01) |

(52) U.S. Cl.
CPC ............. *H03K 17/56* (2013.01); *H02M 1/4225* (2013.01); *H03K 17/163* (2013.01); *H03K 17/168* (2013.01); *Y02B 70/126* (2013.01); *H02M 1/08* (2013.01); *H02M 1/44* (2013.01)
USPC ............ 327/419; 327/108; 327/112; 327/170

(58) Field of Classification Search
USPC ......... 327/108–112, 324, 374–379, 389, 391; 326/22–27, 81–87
See application file for complete search history.

(56) References Cited

U.S. PATENT DOCUMENTS

| 5,986,484 | A * | 11/1999 | Kimata .......................... 327/108 |
|---|---|---|---|
| 7,557,637 | B2 * | 7/2009 | Sakamoto ...................... 327/519 |
| 7,570,085 | B2 * | 8/2009 | Ishikawa et al. ............... 327/108 |
| 7,710,187 | B2 * | 5/2010 | Hiyama ......................... 327/374 |
| 7,737,761 | B2 | 6/2010 | Ishikawa et al. |
| 8,610,485 | B2 * | 12/2013 | Hiyama ......................... 327/324 |
| 2009/0002054 | A1 * | 1/2009 | Tsunoda et al. ............... 327/374 |
| 2010/0079191 | A1 * | 4/2010 | Deboy ............................ 327/379 |
| 2011/0273206 | A1 * | 11/2011 | Lee ................................ 327/109 |
| 2012/0206171 | A1 * | 8/2012 | Kimura ......................... 327/109 |

FOREIGN PATENT DOCUMENTS

| JP | 05-328746 A | 12/1993 |
|---|---|---|
| JP | 2008-092663 A | 4/2008 |
| JP | 2010-252451 A | 11/2010 |

OTHER PUBLICATIONS

Office Action issued by the Australian Government, IP Australia, on Feb. 18, 2014 in the corresponding Australian patent application No. 2013201139.

* cited by examiner

*Primary Examiner* — Brandon S Cole

(74) *Attorney, Agent, or Firm* — Posz Law Group, PLC

(57) ABSTRACT

A switching-element drive circuit that is configured to be applied to a power converter includes: a switching element; and a control unit that controls an operation of the switching element. The control unit includes a drive-voltage control unit that is configured to be capable of changing a switching speed of the switching element based on a power supply current.

13 Claims, 4 Drawing Sheets

SWITCHING-ELEMENT DRIVE CIRCUIT

BACKGROUND OF THE INVENTION

1. Field of the Invention

The present invention relates to a switching-element drive circuit.

2. Description of the Related Art

When designing a power converter, the magnitude of noise occurring from the power converter, frequency components thereof, and the like need to be taken into account. Considering a power converter used in an air conditioner as an example, noises occurring from this type of power converter vary under influences of installation conditions, power supply conditions, operation statuses, individual variation of power converters, and the like. Noise (a noise current) occurring in the power converter is radiated from the power converter as radiation noise, and frequency components of the radiation noise include (specific) noise components equal to integral multiples of a fixed high frequency. Because the frequency components of the radiation noise are the specific frequency components, the radiation noise has a high peak value. Furthermore, a radiation path of the radiation noise is quite complicated. For these reasons, protection (design) against noise is quite difficult in the power converter.

Meanwhile, when a power converter is manufactured and shipped, a reference level with a sufficient margin towards a standard reference needs to be set. Accordingly, it is necessary to provide sufficient measures for suppressing an amount of occurring noise, which leads to increase in sizes of noise suppression parts and increase in the number of the parts.

As a measure for suppressing the amount of occurring noise, reduction in the switching speed of a switching element is conceivable. When the switching speed of a switching element is reduced, the amount of occurring noise can be decreased; on the other hand however, a different problem that a switching loss is increased occurs.

In a switching-element drive circuit described in Japanese Patent Application Laid-open No. 2010-252451, a technique of a switching-element drive circuit of a power converter is disclosed that includes a switching-element drive unit driving a switching element according to a specified current value and controlling a main current flowing through the switching element, and that controls a time rate of change in a drive voltage to be applied to the switching element according to the specified current value.

However, because the time rate of change in the drive voltage to be applied to the switching element is changed according to the specified current value in Japanese Patent Application Laid-open No. 2010-252451, the switching speed cannot be changed within one cycle of an AC power supply. Accordingly, in the conventional technique described in Japanese Patent Application Laid-open No. 2010-252451, it is difficult to disperse noise frequency components under certain load conditions. Furthermore, while a certain effect of reduction in the noise amount is achieved in this conventional technique, the peak component of the noise still remains. Accordingly, this conventional technique is not effective as measures against noise to keep the frequency component of the noise peak within the standard reference and a lot of measures against noise are still required.

The present invention has been made to solve the above problems and an object of the present invention is to provide a switching-element drive circuit that can effectively provide measures against noise to keep the frequency component of a noise peak within the standard reference.

SUMMARY OF THE INVENTION

It is an object of the present invention to at least partially solve the problems in the conventional technology.

To solve the above described problems and achieve the object a switching-element drive circuit that is configured to be applied to a power converter includes: a switching element; and a control unit that controls an operation of the switching element. The control unit includes a drive-voltage control unit that is configured to be capable of changing a switching speed of the switching element based on a power supply current.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a switching-element drive circuit according to the present invention will be explained below in detail with reference to the accompanying drawings. The present invention is not limited to the embodiments.

First Embodiment

Figure 1:
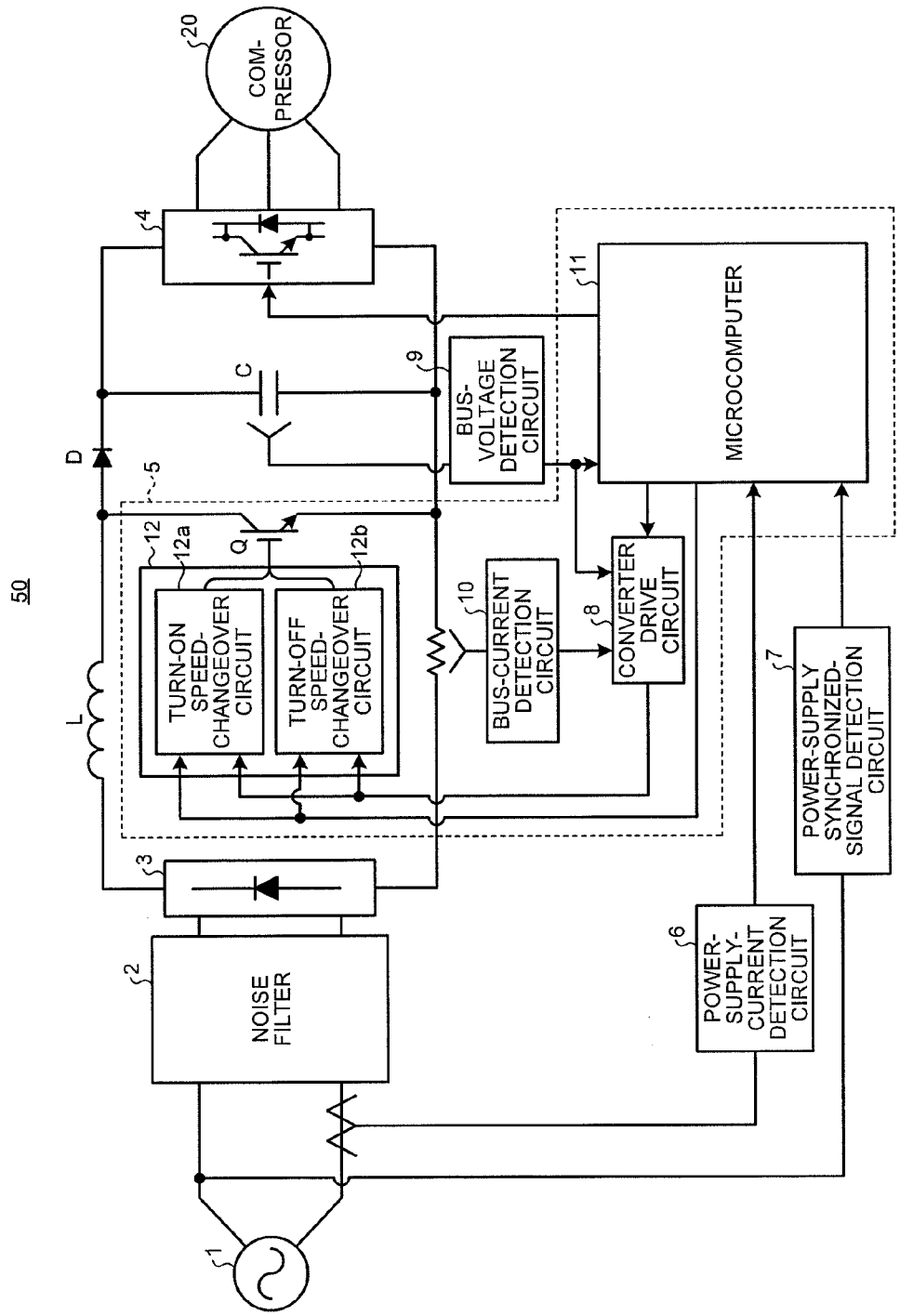
FIG. 1 is a configuration example of a power converter including a switching-element drive circuit according to a first embodiment of the present invention.

FIG. 1 is a configuration example of a power converter 50 including a switching-element drive circuit according to a first embodiment of the present invention, and depicts a general circuit configuration in a case where the power converter 50 drives a compressor 20 used in an air conditioner. In FIG. 1, parts shown by a broken line are a high-efficiency converter 5 functioning as a switching-element drive circuit.

As shown in FIG. 1, the power converter 50 includes a noise filter 2, a rectification circuit 3, a reactor L, a switching element Q, a diode D, a smoothing capacitor C, and an inverter 4 as main circuit parts. As a control system (control unit) that controls the switching element Q and the inverter 4, the power converter 50 also includes a drive-voltage control unit 12 having a turn-ON speed-changeover circuit 12a and a turn-OFF speed-changeover circuit 12b; and a converter drive circuit 8 and a microcomputer 11 that output desired signals to the drive-voltage control unit 12. As a sensor system, the power converter 50 further includes a power-supply-current detection circuit 6 that detects a power supply current; a power-supply synchronized-signal detection circuit 7 that uses information of a frequency (a power supply frequency) of an AC power supply 1 and detects a signal synchronized with the power supply frequency; a bus-voltage detection circuit 9 that detects a bus voltage; and a bus-current detection circuit 10 that detects a bus current.

The rectification circuit 3 mainly includes a bridge circuit of diodes, and rectifies an AC voltage from the AC power supply 1 via the noise filter 2. The smoothing capacitor C smoothes the voltage rectified by the rectification circuit 3. The inverter 4 converts the voltage smoothed by the smoothing capacitor C into an AC voltage at a desired level and at a desired frequency and drives the compressor 20. The reactor L and the diode D for backward-flow prevention are series-connected in this order between the rectification circuit 3 and the smoothing capacitor C. The switching element Q included in the high-efficiency converter 5 is connected between connection ends of the reactor L and the diode D and a negative DC bus.

In FIG. 1, the bus-current detection circuit 10 is depicted as an internal constituent part of the high-efficiency converter 5; and the power-supply-current detection circuit 6, the power-supply synchronized-signal detection circuit 7, and the bus-voltage detection circuit 9 are depicted as external constituent parts, however this configuration is for the sake of convenience and arbitrary. For example, when a function corresponding to the bus-current detection circuit 10 is included as an existing function, an output of this function unit may be input to the converter drive circuit 8. Conversely when the power-supply-current detection circuit 6 and the power-supply synchronized-signal detection circuit 7 are provided to realize a function of the first embodiment, the circuits 6 and 7 may be regarded as constituent parts of the high-efficiency converter 5.

A basic operation of the high-efficiency converter 5 will be explained below. First, a bus-voltage specification value from the microcomputer 11, a detection value of the bus voltage (a bus-voltage detection value) detected by the bus-voltage detection circuit 9, and a detection value of the bus current (a bus-current detection value) detected by the bus-current detection circuit 10 are input to the converter drive circuit 8. The converter drive circuit 8 outputs a command signal (a pulse-width modulation (PWM) signal) obtained by correcting with the bus-voltage specification value, the bus-voltage detection value, and the bus-current detection value as a switching pulse to drive the switching element Q.

The drive-voltage control unit 12 is provided to realize a function of the first embodiment explained later, and the command signal from the converter drive circuit 8 and changeover signals (changeover signals 1 and 2 explained later) from the microcomputer 11 are input to the drive-voltage control unit 12. The command signals generated by the microcomputer 11 are generated based on: a detection value of the power supply current (a power-supply-current detection value) detected by the power-supply-curredetection circuit 6; and a zero-cross signal (power-supply zero cross) detected by the power-supply synchronized-signal detection circuit 7.

Figure 2:
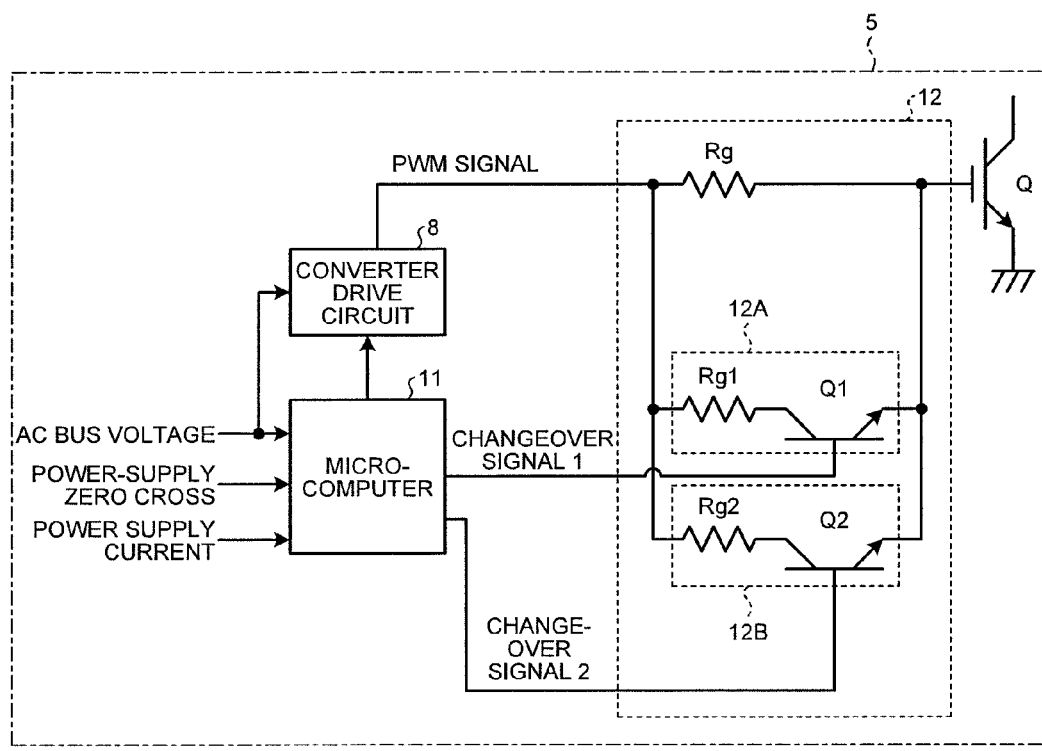
FIG. 2 is a configuration example of a high-efficiency converter according to the first embodiment.

FIG. 2 is a configuration example of the high-efficiency converter 5 according to the first embodiment, and depicts a detailed configuration of the drive-voltage control unit 12 in the high-efficiency converter 5. Like references in FIG. 2 denote like parts in FIG. 1.

In FIG. 2, a first gate-resistance change circuit 12A and a second gate-resistance change circuit 12B that are connected in parallel to a gate resistor Rg connected between the converter drive circuit 8 and the switching element Q are illustrated as circuits that realize functions of the turn-ON speed-changeover circuit 12a and the turn-OFF speed-changeover circuit 12b illustrated in FIG. 1. The first gate-resistance change circuit 12A includes a series circuit of a first resistor Rg1 and a first switching element Q1, and the second gate-resistance change circuit 12B includes a series circuit of a second resistor Rg2 and a second switching element Q2.

Figure 4:
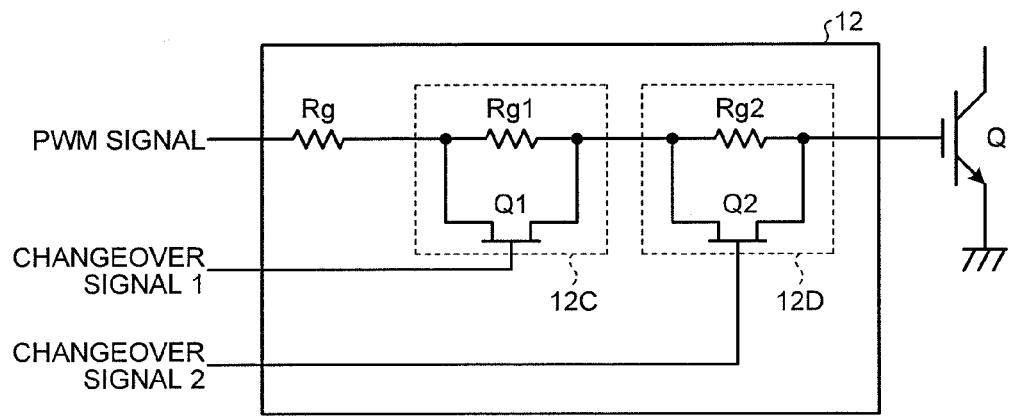
FIG. 4 is another configuration example of the power converter according to the first embodiment.

According to FIG. 2 the first gate-resistance change circuit 12A including the series circuit of the first resistor Rg1 and the first switching element Q1 and the second gate-resistance change circuit 12B including the series circuit of the second resistor Rg2 and the second switching element Q2 are connected in parallel to the gate resistor Rg. However, according to FIG. 4, a first gate-resistance change circuit 12C including a parallel circuit of the first resistor Rg1 and the first switching element Q1 and a second gate-resistance change circuit 12D including a parallel circuit of the second resistor Rg2 and the second switching element Q2 may be connected in series with the gate resistor Rg as illustrated in FIG. 4.

While the two gate-resistance change circuits are provided in FIG. 2, three or more gate-resistance change circuits may be provided. When more gate-resistance change circuits are provided, the gate resistance can be more finely changed.

Figure 3:
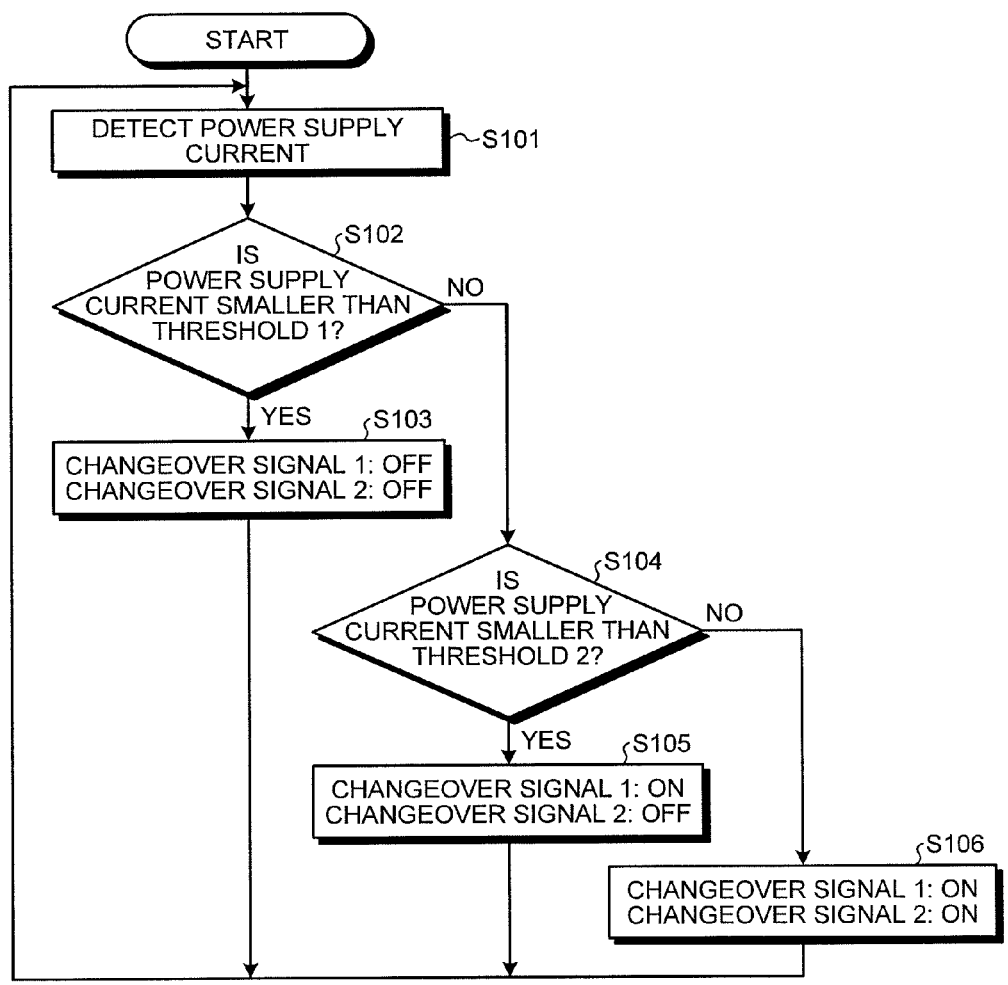
FIG. 3 is a flowchart related to a switching-speed changeover control in the first embodiment.

An operation of relevant parts of the high-efficiency converter 5, that is, an operation of the drive-voltage control unit 12 according to the first embodiment will be explained next with reference to FIGS. 2 and 3. FIG. 3 is a flowchart related to a switching-speed changeover control in the first embodiment.

An amount of noise occurring from the high-efficiency converter 5 is previously measured by the relationship with a gate resistance (a switching speed) and/or a power supply current and is recorded in the microcomputer 11 as a data table (not shown). A "threshold 1" and a "threshold 2" explained later are also recorded in this data table.

At Step S101, a power supply current is detected and input to the microcomputer 11. At Step S102, the power-supply-current detection value and the "threshold 1" as a first threshold are compared in terms of magnitudes. When the power-supply-current detection value is smaller than the threshold 1 (YES at Step S102), the microcomputer 11 generates the changeover signal 1 that turns OFF the switching element Q1 (hereinafter, "changeover signal 1: OFF", and similar notation is used for the changeover signal 2) and the changeover signal 2 that turns OFF the switching element Q2, and outputs the generated changeover signals 1 and 2 (Step S103). The operation then returns to the process at Step S101.

When the power-supply-current detection value is equal to or larger than the threshold 1 (NO at Step S102), further the power-supply-current detection value is compared with the "threshold 2" as a second threshold, which is larger than the "threshold 1", in terms of magnitudes at Step S104. When the power-supply-current detection value is smaller than the threshold 2 (YES at Step S104), the microcomputer 11 generates the changeover signal 1 that turns ON the switching element Q1 (hereinafter, "changeover signal 1: ON", and "changeover signal 2: OFF") and the changeover signal 2 that turns OFF the switching element Q2 and outputs the generated changeover signals 1 and 2 (Step S105). The operation then returns to the process at Step S101 as at Step S103. When the power-supply-current detection value is equal to or larger than the threshold 2 (NO at Step S104), the microcomputer 11 generates the changeover signal 1 that turns ON the switching element Q1 and the changeover signal 2 that turns ON the switching element Q2 and outputs the generated changeover signals 1 and 2 (Step S106). The operation then returns to the process at Step S101 similarly as at Steps S103 and S105.

When the changeover signals 1 and 2 that control both of the switching elements Q1 and Q2 to be OFF are output as at Step S103, only the resistor Rg is connected to the gate of the switching element Q and thus the gate resistance has the highest value.

When the control to cause the changeover signal 1 to be ON and the changeover signal 2 to be OFF is performed as at Step S105, the resistors Rg and Rg1 are connected to the gate of the switching element Q. Accordingly, a total gate resistance is a combined resistance of the resistors Rg and Rg1 and thus the resistance becomes lower than that at Step S103.

When the control to cause both of the changeover signals 1 and 2 to be ON is performed as at Step S106, the resistors Rg, Rg1, and Rg2 are connected to the gate of the switching element Q. Accordingly, a total gate resistance is a combined resistance of the resistors Rg, Rg1, and Rg2 and thus the resistance becomes much lower.

The controls mentioned above are summarized as follows.

(1) When the control to cause both of the switching elements Q1 and Q2 to be OFF is performed, the total gate resistance becomes the highest and thus the switching speed becomes the lowest.

(2) When the control to cause both of the switching elements Q1 and Q2 to be ON is performed, the total gate resistance becomes the lowest and thus the switching speed becomes the highest.

(3) When the control to cause the switching element Q1 to be ON and the switching element Q2 to be OFF is performed, the total gate resistance has a value between (1) and (2) and thus the switching speed is higher than (1) and lower than (2).

In this way, the control shown in the flowchart of FIG. 3 is performed for each carrier cycle. With this control, a desired gate resistance can be selected to change the switching speed at each timing in each carrier cycle.

With the switching-speed changeover control mentioned above, an effect shown below is obtained.

First, when the power supply current is low, the gate resistance is increased to decrease the switching speed, thereby reducing noise. When the current increases, the gate resistance is decreased to increase the switching speed, thereby suppressing the switching loss. With this control, the loss can be reduced while the noise peak is suppressed.

Furthermore, because the AC power supply is used, the current increases and decreases in one power supply cycle. Accordingly, when the changeover of the gate resistance is performed in each carrier cycle, the switching speed can be changed within one power supply cycle, which is longer than the carrier cycle, thereby the frequencies of the noise components can be dispersed. As a result, specific noise frequency components can be suppressed.

As explained above, with the switching-speed changeover control according to the first embodiment, the gate resistance is increased to suppress the switching speed when the power supply current is low, and the gate resistance is decreased to increase the switching speed when the current becomes higher. Therefore, the loss can be reduced while suppressing the noise peak.

With the switching-speed changeover control according to the first embodiment, the switching speed can be changed within one power supply cycle. Therefore, the frequencies of the noise components can be dispersed to suppress the peak and thus an effective drive control can be achieved by tradeoff between the occurring noise and the switching loss.

With the switching-speed changeover control according to the first embodiment, a noise-reduction-oriented control can be performed in a low current region while an efficiency-oriented control can be performed in a high current region. Therefore, noise filter parts can be reduced in number and downsized, and power consumption efficiency of the device can be improved. As a result, measures against noise to keep the frequency component of the noise peak within the standard reference can be easily and effectively provided.

Second Embodiment

While the control to select the gate resistance for each carrier cycle is performed in the first embodiment, the gate resistance can be selected for each power supply phase. Because a general active converter (the high-efficiency converter 5 in the first embodiment is also an example thereof) detects a power-supply synchronized signal (zero cross) in the usual control, the power supply frequency can be calculated based on the time between zero cross points. When the power supply frequency is known, the current power supply phase can be calculated based on the time from the zero cross point. Therefore, in a second embodiment of the present invention, also when the gate resistance is selected for each power supply phase, the switching speed can be changed within one power supply cycle as in the first embodiment, and effects identical to those in the first embodiment can be obtained.

Third Embodiment

In a third embodiment of the present invention, a switching element used in a high-efficiency converter will be explained. A switching element made of silicon (Si) (such as an IGBT or a MOSFET, hereinafter, "Si element") is generally used as a switching element in a high-efficiency converter. In the switching-speed changeover control explained in the first and second embodiments, the general Si element can be used as the switching element of the high-efficiency converter.

Meanwhile, the switching element of the high-efficiency converter in the techniques explained in the first and second embodiments is not limited to the Si element. It is quite useful that a switching element made of silicon carbide (SiC) (hereinafter, "SiC element"), which has recently received attention, is applied to the switching element of the high-efficiency converter, instead of the Si element.

The SiC element is characterized such that the switching time can be considerably shorter than (less than about one tenth of) that of common elements (Si element, for example). Accordingly, use of the SiC element can realize increase in the frequency. Because the switching loss is reduced, the loss in the steady state can be also greatly reduced (to less than about one tenth). Therefore, for example, even when the switching speed is decreased to suppress noise in the low current region, increase in the loss can be suppressed. In the high current region, the loss can be reduced by setting the switching speed at a relatively high level.

The SiC element is also characterized such that it can be used at high temperatures. Accordingly, when the SiC element is used as the switching element included in the high-efficiency converter, an allowable operation temperature of a switching element module can be raised. Therefore, the carrier frequency can be increased to increase the switching speed during the control of the switching element.

In this case, SiC is an example of semiconductors which are called as wide bandgap semiconductors in view of a property that the bandgap is larger than that of Si. In addition to SiC, for example, gallium nitride (GaN) and a semiconductor made by using diamond also belong to the wide bandgap semiconductors and properties thereof have many similarities to SiC. Therefore, configurations using wide bandgap semiconductors other than SiC also fall within the scope of the inventions according to the first to third embodiments.

The switching element made of such a wide bandgap semiconductor has a high withstand voltage and a high allowable current density. Therefore, the switching element can be downsized and, when the downsized switching element is used, a semiconductor module having the switching element incorporated can be downsized.

A transistor element or a diode element made of a wide bandgap semiconductor has also a high heat resistance. Therefore, a cooler such as a heat sink can be downsized and the switching element module can be further downsized.

The switching element made of a wide bandgap semiconductor has a low power loss and thus the efficiency of the switching element can be enhanced, which contributes to increase in the efficiency of the switching element module.

According to the present invention, the loss can be reduced while the noise peak is suppressed. According to the present invention, measures against noise to keep the frequency component of the noise peak within the standard reference can be effectively achieved.

The configurations described in the first to third embodiments are only an example of the configuration of the present invention, and these configurations can be combined with other publicly-known techniques. Furthermore, it is needless to mention that the present invention can be configured while modifying it without departing from the scope of the invention, such as omitting a part of the configuration.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A switching-element drive circuit that is configured to be applied to a power converter comprising:
    a switching element; and
    a control unit that controls an operation of the switching element, wherein
    the control unit includes a drive-voltage control unit that is configured to be capable of changing a switching speed of the switching element based on a power supply current, wherein when changing the switching speed for each carrier cycle, the drive-voltage control unit is configured to decrease the switching speed when the power supply current is lower than a first threshold, and to increase the switching speed when the power supply current is higher than the first threshold and is equal to or lower than a second threshold that is larger than the first threshold.

2. The switching-element drive circuit according to claim 1, wherein the drive-voltage control unit is configured to change the switching speed for each carrier cycle.

3. The switching-element drive circuit according to claim 1, wherein the drive-voltage control unit is configured to change the switching speed according to a power supply phase.

4. The switching-element drive circuit according to claim 1, wherein, when changing the switching speed for each carrier cycle,
    the drive-voltage control unit is configured to
        further increase the switching speed when the power supply current is higher than the second threshold.

5. The switching-element drive circuit according to claim 1, wherein the switching element is made of a wide bandgap semiconductor.

6. The switching-element drive circuit according to claim 5, wherein the wide bandgap semiconductor is made of a substance selected from silicon carbide, gallium nitride (GaN), and diamond.

7. The switching-element drive circuit according to claim 1, further comprising:
    a first gate resistance change circuit that is connected between the control unit and the switching element to decrease a gate resistance of the switching element when turned on; and
    a second gate resistance change circuit connected between the control unit and the switching element to decrease the gate resistance of the switching element when turned on, wherein
    the drive-voltage control unit is configured to decrease the switching speed of the switching element when the power supply current is lower than the first threshold by turning off both the first gate resistance circuit and the second gate resistance circuit to thereby increase an overall gate resistance of the switching element, and
    the drive-voltage control unit is configured to increase the switching speed of the switching element by turning on the first gate resistance circuit and turning off the second gate resistance circuit when the power supply current is higher than the first threshold and is equal to or lower than the second threshold that is larger than the first threshold to thereby decrease the overall gate resistance of the switching element relative to the overall gate resistance when the power supply current is lower than the first threshold.

8. The switching-element drive circuit according to claim 7, wherein the drive-voltage control unit is configured to reduce noise caused by the switching element when the power supply current is lower than the first threshold by turning off both the first gate resistance circuit and the second gate resistance circuit.

9. The switching-element drive circuit according to claim 7, wherein the drive-voltage control unit is configured to suppress a noise peak caused by the switching element as well as switching loss by turning on the first gate resistance circuit and turning off the second gate resistance circuit when the power supply current is higher than the first threshold and is equal to or lower than the second threshold.

10. The switching-element drive circuit according to claim 7, wherein
    the drive-voltage control unit is configured to further increase the switching speed of the switching element by turning on both the first gate resistance circuit and the second gate resistance circuit when the power supply current is higher than the second threshold to thereby decrease the overall gate resistance of the switching element relative to the overall gate resistance when the power supply current is higher than the first threshold and less than or equal to the second threshold.

11. The switching-element drive circuit according to claim 10, wherein
    the drive-voltage control unit is configured to further suppress a noise peak caused by the switching element as well as further reduce the switching loss by turning on both the first gate resistance circuit and the second gate resistance circuit when the power supply current is higher than the second threshold.

12. The switching-element drive circuit according to claim 7, wherein the first gate resistance change circuit comprises a combination of a first switching element and a first resistor, and the second gate resistance change circuit comprises a combination of a second switching element and a second resistor.

13. A power converter switching-element drive circuit comprising:
- a switching element;
- a control unit that includes a drive-voltage control unit that is configured to change a switching speed of the switching element based on a detected power supply current,
- a first gate resistance change circuit that is connected between the control unit and the switching element; and
- a second gate resistance change circuit connected between the control unit and the switching element, wherein
- the drive-voltage control unit is configured to control a switching speed of the switching element during each carrier cycle based on a detected value of the power supply current by selectively turning the first gate resistance circuit and the second gate resistance circuit on and off to disperse noise components and thereby minimize noise and switching loss during switching-speed changeover control.

* * * * *